(12) United States Patent
Hidaka

(10) Patent No.: US 7,795,657 B2
(45) Date of Patent: Sep. 14, 2010

(54) SEMICONDUCTOR MEMORY DEVICE INCLUDING A SOURCE AND A DRAIN OF A MEMORY CELL TRANSISTOR FORMED BETWEEN ELECTRODES AND A METHOD OF FABRICATION THE SAME

(75) Inventor: Osamu Hidaka, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 246 days.

(21) Appl. No.: 11/772,396

(22) Filed: Jul. 2, 2007

(65) Prior Publication Data

US 2008/0061333 A1    Mar. 13, 2008

(30) Foreign Application Priority Data

Sep. 8, 2006    (JP)    ............... 2006-244760

(51) Int. Cl.
   *H01L 27/108*    (2006.01)
   *H01L 29/94*    (2006.01)
   *H01L 25/065*    (2006.01)

(52) U.S. Cl. .............. 257/295; 257/296; 257/303; 257/306; 257/E25.013

(58) Field of Classification Search ........... 257/295, 257/296, 303, 306, E25.013
See application file for complete search history.

(56) References Cited

U.S. PATENT DOCUMENTS 5,914,504 A * 6/1999 Augusto ............... 257/192
6,211,531 B1 * 4/2001 Nakazato et al. .......... 257/28
6,438,019 B2   8/2002 Hartner et al.
6,525,357 B1   2/2003 Amano et al.
6,532,165 B1 * 3/2003 Katori ................. 365/145
6,611,014 B1   8/2003 Kanaya et al.
6,680,499 B2   1/2004 Kumura et al.
6,744,087 B2 * 6/2004 Misewich et al. ........ 257/295
6,867,447 B2   3/2005 Summerfelt
6,982,453 B2   1/2006 Kanaya et al.
2003/0178660 A1 * 9/2003 Schmid et al. .......... 257/296

* cited by examiner

*Primary Examiner*—Anh Phung
*Assistant Examiner*—Allison P Bernstein
(74) *Attorney, Agent, or Firm*—Oblon, Spivak, McClelland, Maier & Neustadt, L.L.P.

(57) ABSTRACT

A semiconductor memory device includes a memory cell portion, the memory cell portion including a ferroelectric capacitor and a memory cell transistor, the ferroelectric capacitor including a first electrode film on a semiconductor substrate, a second electrode film over the first electrode film, and a ferroelectric film between the first and second electrode films, and the memory cell transistor including a source and a drain between the first and second electrode films, wherein either the source or the drain connects to the first electrode film, and the other of the source or the drain connects to the second electrode film.

5 Claims, 14 Drawing Sheets

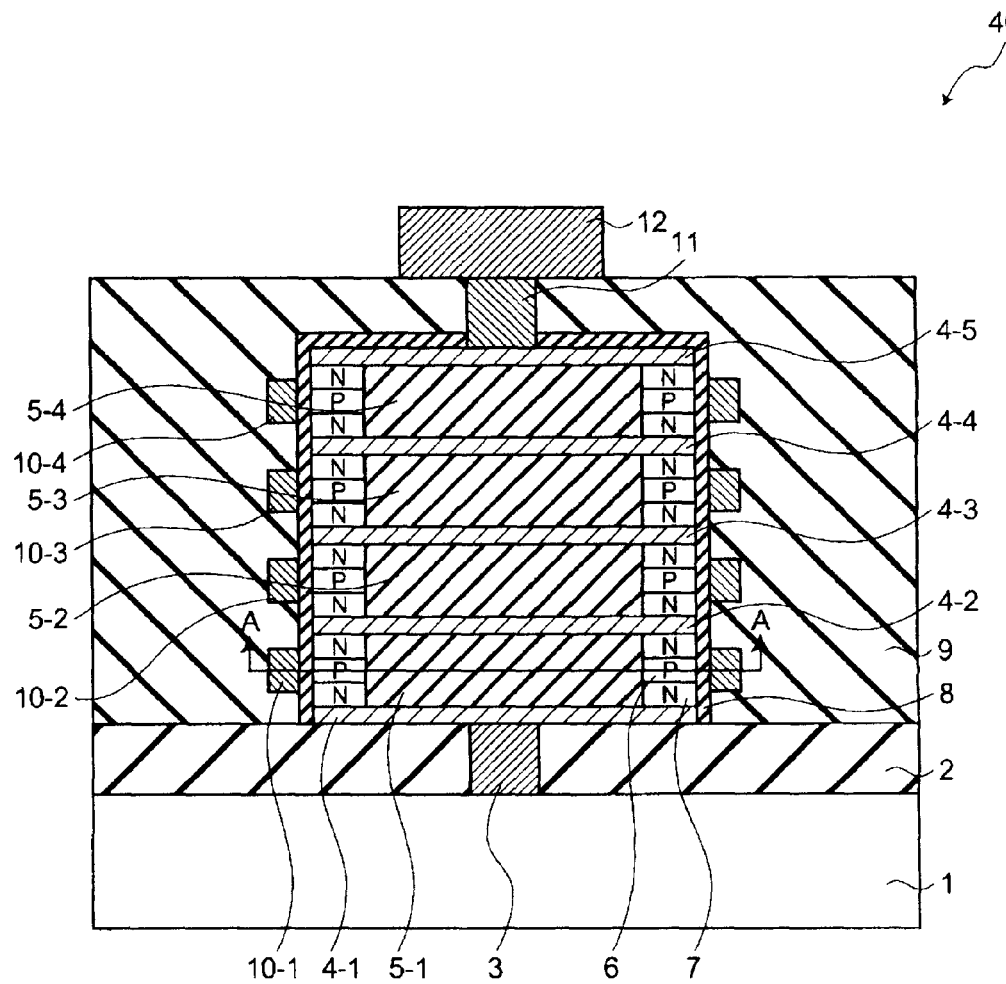
F I G . 1

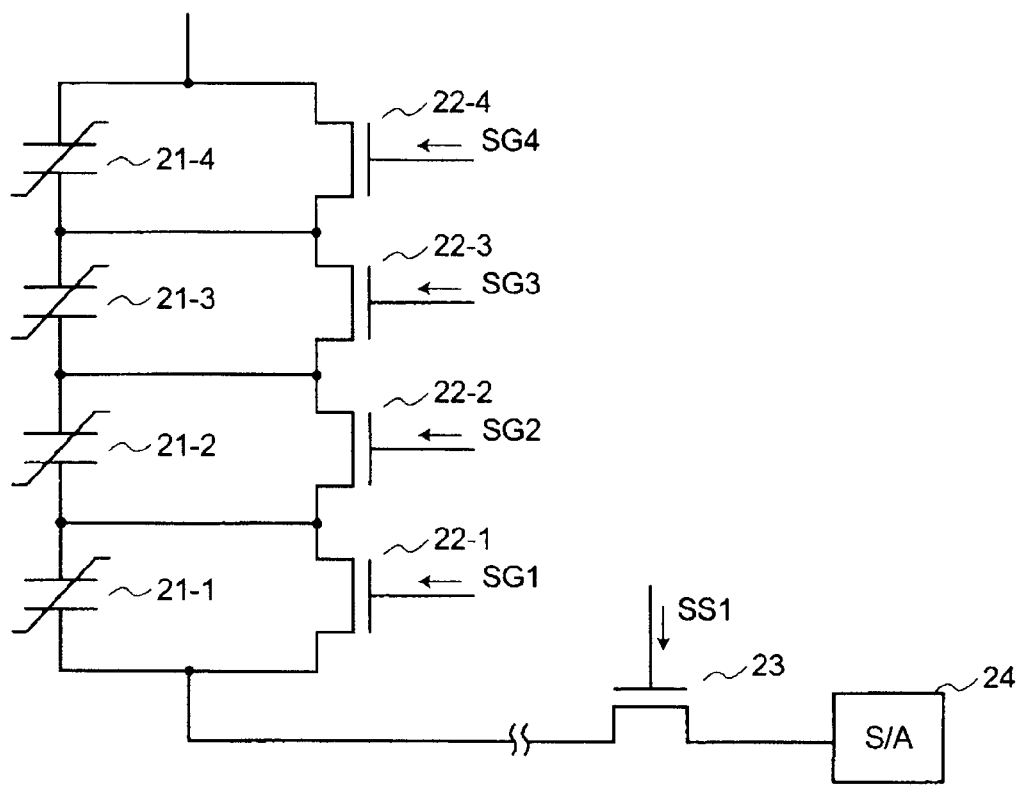
F I G. 3

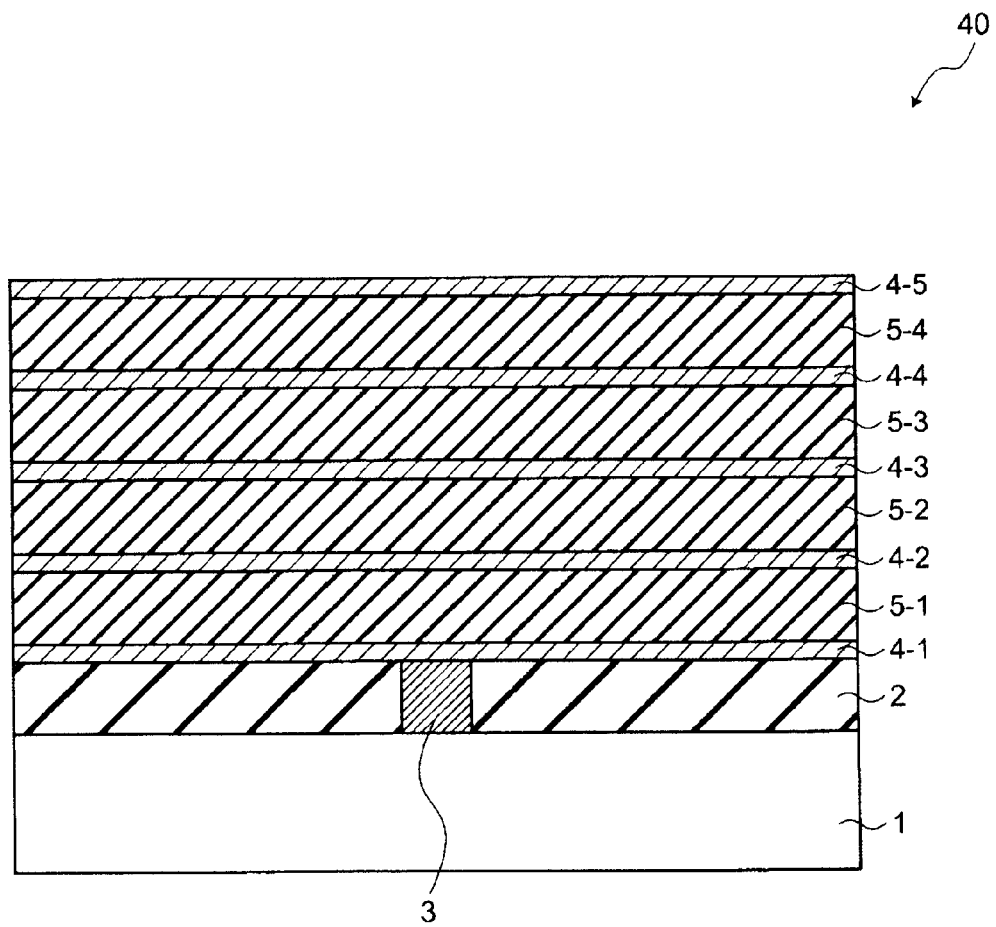
F I G . 4

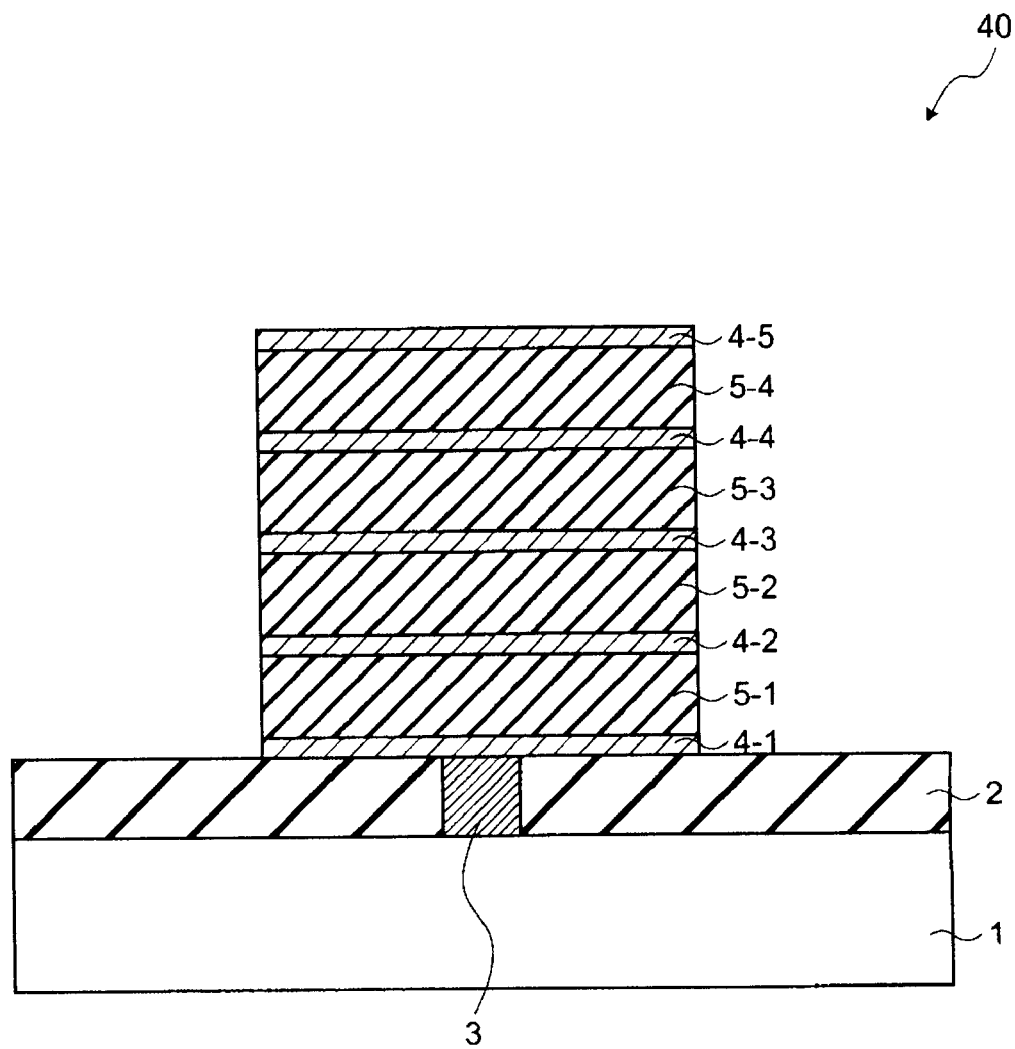
F I G . 5

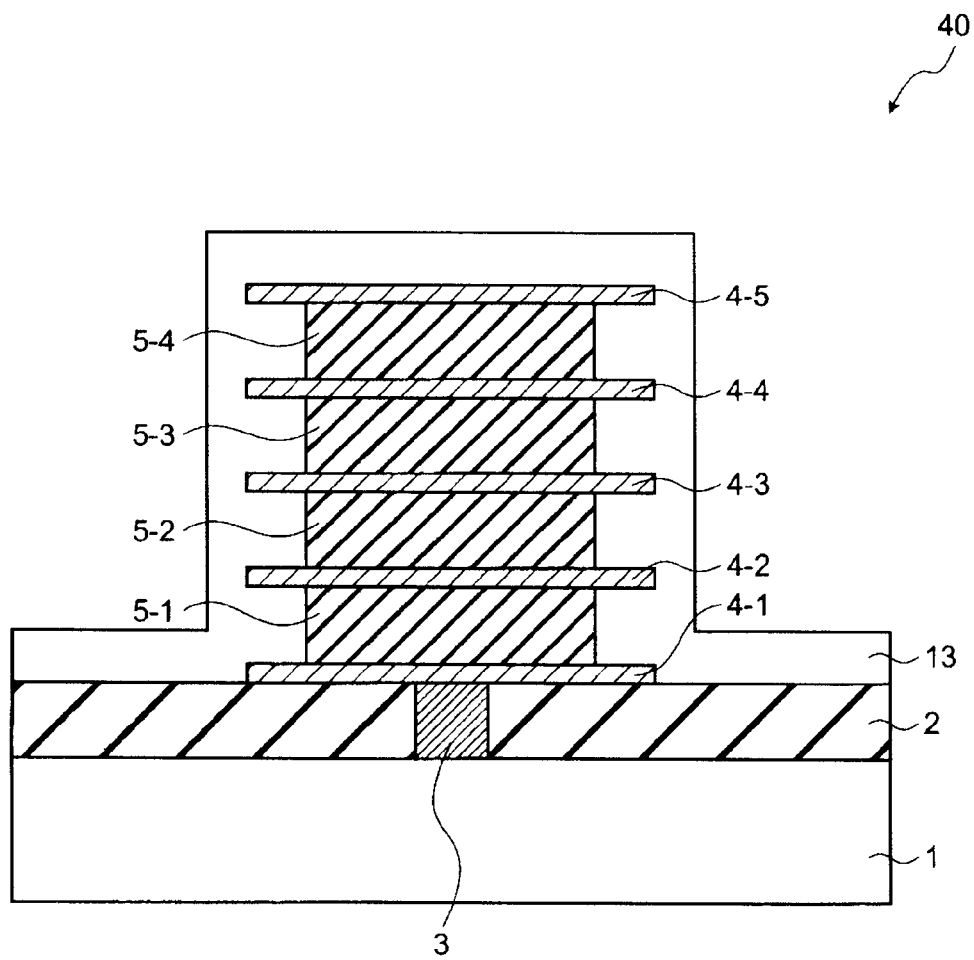
F I G . 7

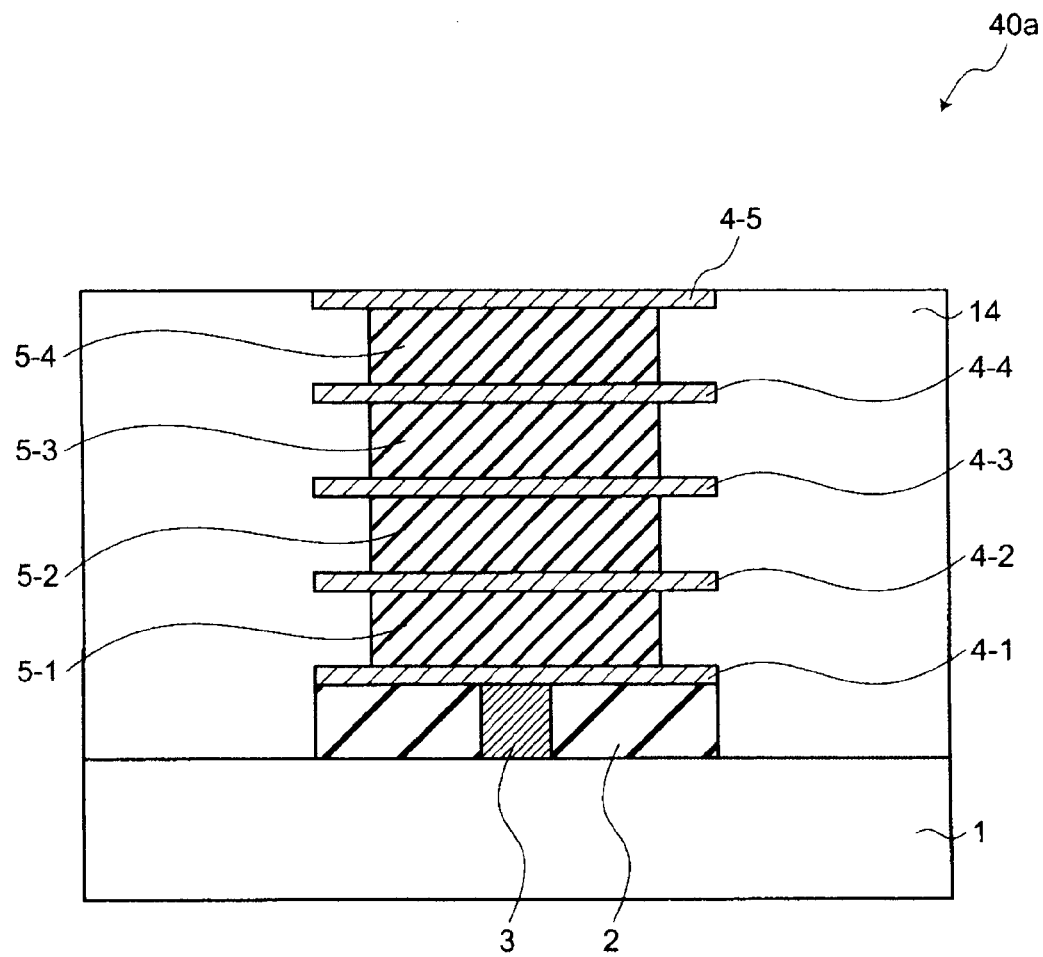
F I G. 1 1

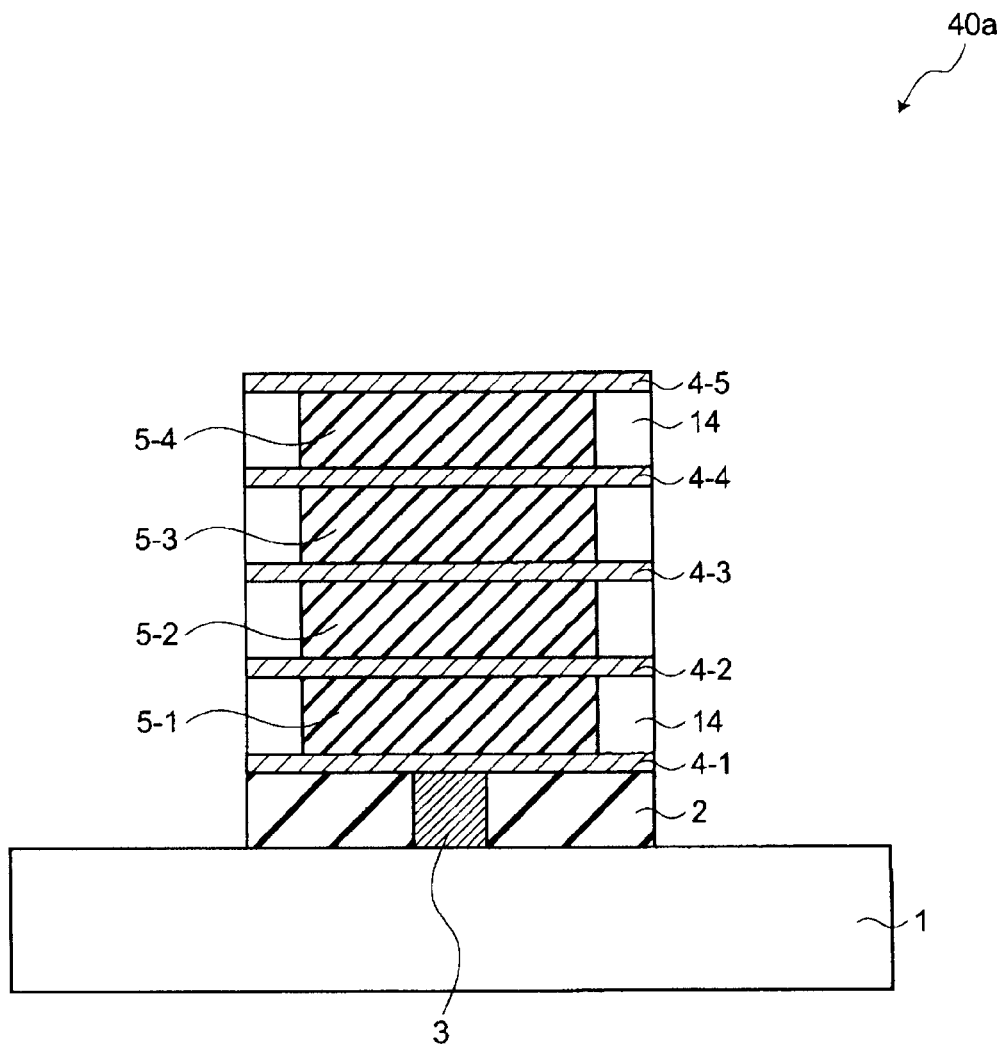
F I G. 1 2

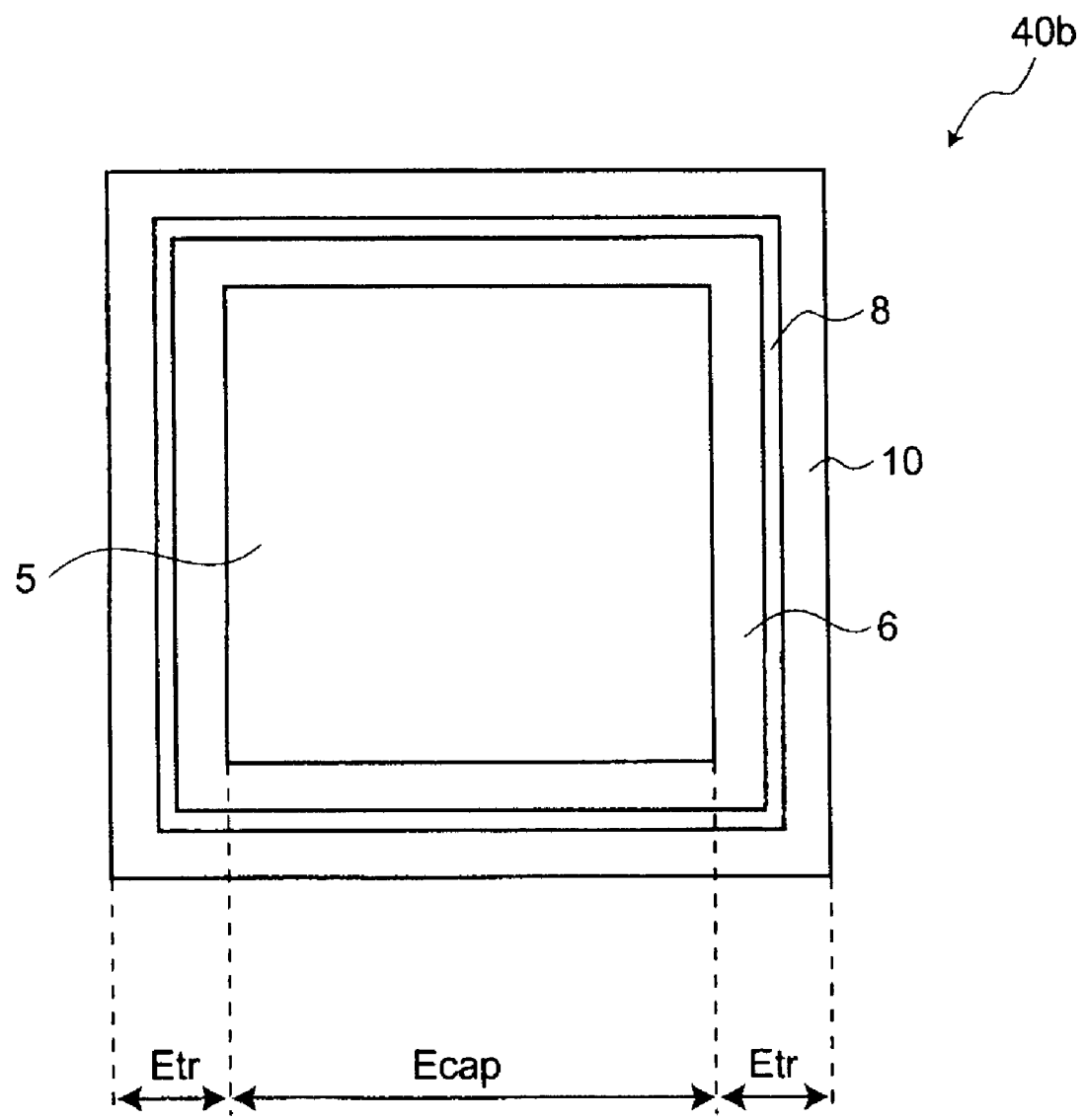
F I G . 1 4

SEMICONDUCTOR MEMORY DEVICE INCLUDING A SOURCE AND A DRAIN OF A MEMORY CELL TRANSISTOR FORMED BETWEEN ELECTRODES AND A METHOD OF FABRICATION THE SAME

CROSS REFERENCE TO RELATED APPLICATION

This application is based upon and claims the benefit of priority from the prior Japanese Application (No. 2006-244760, filed Sep. 8, 2006), the entire contents of which are incorporated herein by reference.

FIELD OF THE INVENTION

The present invention relates to a semiconductor memory device and a method of fabricating the semiconductor memory device, and in particular, to a ferroelectric memory device and a method of fabricating the ferroelectric memory device.

DESCRIPTION OF THE BACKGROUND

A non-volatile memory in next generation have been developed to realize that rewriting speed and number of rewriting of the non-volatile memory are higher than and five orders of magnitude larger than those of a conventional EEPROM or a conventional flash memory, respectively. Furthermore, it is desirable that characteristics of the non-volatile memory such as capacity, speed or cost are comparable with those of a conventional DRAM.

A FeRAM (Ferroelectric Random Access Memory), a MRAM (Magnetic Random Access Memory), a PRAM (Phase Change Random Access Memory), a RRAM (Resistive Random Access Memory) or the like are nominated as the next generation non-volatile memory. A memory cell in a FeRAM is composed of a ferroelectric capacitor and a transistor as shown in Japanese Patent Publication (Kokai) No. 2002-217381 (P15, FIGS. 2 and 5), for example.

As shown in Japanese Patent Publication (Kokai) No. 2002-217381 (P15, FIGS. 2 and 5) or the like, miniaturization of the ferroelectric capacitor and the transistor in plane is necessary for highly integrating the memory cell of the FeRAM. However, there are several problems. For example, a lithographic limitation causes a physical limitation in the miniaturization in plane. Moreover, degradation of the ferroelectric capacitor and the transistor is produced by the miniaturization. Therefore, desirable characteristics of the FeRAM cannot be retained.

SUMMARY OF INVENTION

According to an aspect of the invention, there is provided a semiconductor memory device including, a memory cell portion, the memory cell portion having a ferroelectric capacitor and a memory cell transistor, the ferroelectric capacitor having a plurality of electrode films and a ferroelectric film, the plurality of electrode films being stacked in layers on a semiconductor substrate, the ferroelectric film being formed between the plurality of electrode films, a source and a drain of the memory cell transistor being formed between the electrode films, the source and the drain directly contacting the ferroelectric film or indirectly contacting the ferroelectric film via an insulator, one of the source and the drain being connected to a first one of the plurality of electrode films, and the other of the source and the drain being connected to a second one of the plurality of electrode films.

Further, according to another aspect of the invention, there is provided a method for manufacturing a semiconductor memory device including the memory cell portion having a ferroelectric capacitor and a memory cell transistor, the ferroelectric capacitor being composed of a plurality of electrode films stacked in layer on a semiconductor substrate and a ferroelectric film formed between the plurality of electrode films, the memory cell being formed between the plurality of electrode films to directly contact the ferroelectric film or indirectly contact the ferroelectric film via an insulator, one of a source and a drain of the memory cell transistor being connected with one of the electrode films and the other of the source and the drain being connected with the other of the electrode film, removing an end portion of the ferroelectric film by etching to form a space between end portions of the electrode film, selectively forming a silicon film in the space so as to contact with the ferroelectric film, diffusing impurities in the electrode film into the silicon film by annealing treatment so as to form the source and the drain of the memory cell transistor, forming a gate electrode on a channel region interposed between the source and the drain via a gate insulator.

Further, according to another aspect of the invention, there is provided a method for manufacturing a semiconductor memory device including a plurality of memory cell portions, including each of memory cell portions having a ferroelectric capacitor and a memory cell, the ferroelectric capacitor having an upper electrode film and a lower electrode film at the main surface side of a semiconductor substrate and the ferroelectric film between the upper electrode film and the lower electrode film, the lower electrode film of the memory cell portion and the upper electrode film of the upper memory cell portion being shared as the electrode film, a source and a drain of the memory cell being formed between the plurality of electrode films to contact with the ferroelectric film, one of the source and the drain of the memory cell being connected with the upper electrode film and the other of the source and the drain being connected with the lower electrode film, removing an end portion of the ferroelectric film by etching so as to form a space between the end portions of the upper electrode film and the lower electrode film, selectively forming silicon film in the space so as to contact with the ferroelectric film, diffusing impurities in the electrode film into the silicon film by annealing treatment so as to form the source and the drain of the memory cell, forming a gate electrode on a channel region interposed between the source and the drain via a gate insulator.

BRIEF DESCRIPTION OF THE DRAWINGS

FIG. 1 is a schematic cross-sectional view showing a ferroelectric memory including a memory cell portion in a first embodiment of the present invention;

FIG. 3 is an equivalent circuit diagram showing the ferroelectric memory including the memory cell portion in the first embodiment of the present invention;

FIG. 4 is a schematic cross-sectional view showing a processing step on the ferroelectric memory including the memory cell portion in the first embodiment of the present invention;

FIG. 5 is a schematic cross-sectional view showing a processing step on the ferroelectric memory including the memory cell portion in the first embodiment of the present invention;

FIG. 7 is a schematic cross-sectional view showing the processing step on the ferroelectric memory including the memory cell portion in the first embodiment of the present invention;

FIG. 11 is a schematic cross-sectional view showing a processing step on the ferroelectric memory including the memory cell portion in the second embodiment of the present invention;

FIG. 12 is a schematic cross-sectional view showing the processing step on the ferroelectric memory including the memory cell portion in the second embodiment of the present invention;

FIG. 14 is a schematic plane view showing a ferroelectric memory including a memory cell portion in the third embodiment of the present invention;

DETAILED DESCRIPTION OF THE INVENTION

Figure 2:
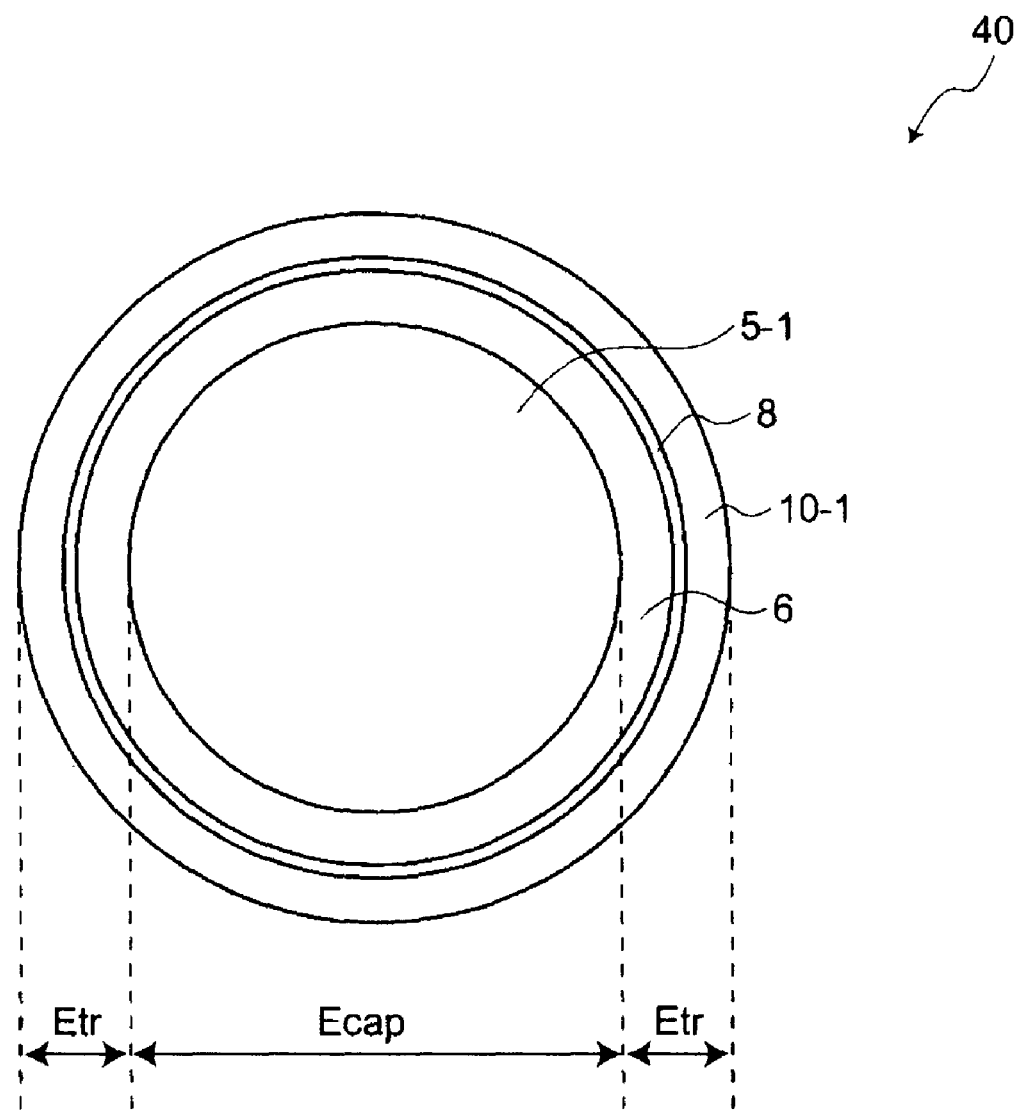
FIG. 2 is a schematic plane view along line A-A in FIG. 1 showing the ferroelectric memory including the memory cell portion in the first embodiment of the present invention.

Embodiments of the present invention will be described below in detail with reference to the drawing mentioned above.

First Embodiment

First, a semiconductor memory device and a fabricating method of the semiconductor memory device according to a first embodiment of the present invention will be described below in detail with reference to the drawing mentioned above.

FIG. 1 is a schematic cross-sectional view showing a ferroelectric memory including a memory cell portion in a first embodiment of the present invention. FIG. 2 is a schematic plane view along line A-A in FIG. 1 showing the ferroelectric memory including the memory cell portion in the first embodiment of the present invention. FIG. 3 is an equivalent circuit diagram showing the ferroelectric memory including the memory cell portion in the first embodiment of the present invention.

The ferroelectric capacitor and the memory cell are formed over a semiconductor substrate in layer in the first embodiment.

As shown in FIG. 1, a ferroelectric memory 40 is a Chain FeRAM (Ferroelectric Random Access Memory) as a ferroelectric memory. The ferroelectric memory 40 having a plurality of cylindrical memory cell portions is formed on the semiconductor substrate 1. Ferroelectric capacitors and memory cells are stacked in layer. In each memory cell portion, the ferroelectric capacitor and the memory cell are in parallel connected along the longitudinal direction. The ferroelectric capacitor has a layered structure being composed of a lower electrode film, a ferroelectric film and an upper electrode film. The memory cell transistor is configured between the lower electrode film and the upper electrode film so as to contact with the ferroelectric film. The memory cell portion is connected with the semiconductor substrate 1 via interconnection layer 3. Here, a silicon substrate is used as the semiconductor substrate 1, however, an SOI (Silicon on Insulator) substrate or the like may be used.

The interconnection layer 3 is embedded in an opening of an insulator 2 as an inter-layer insulator on the semiconductor substrate 1. The interconnection layer 3 is connected to the semiconductor substrate 1. An electrode film 4-1 is configured on the insulator 2 and the interconnection layer 3. The electrode film 4-1 is connected to the interconnection layer 3. Both end portions of the electrode film 4-1 are contact with a gate insulator 8. The interconnection layer 3 is electrically connected to the semiconductor substrate 1 and the electrode film 4-1 as the lower electrode of the memory cell portion. A ferroelectric film 5-1 is configured between the electrode film 4-1 and an electrode film 4-2. An N-layer 7 on the electrode film 4-1 is connected to the electrode film 4-1. One end of the N-layer 7 contacts with the ferroelectric film 5-1 and the other end of the N-layer 7 contact with the gate insulator 8. The N-layer 7 beneath the electrode film 4-2 is connected to the electrode film 4-2. One end of the N-layer 7 contact with the ferroelectric film 5-1 and the other end of the N-layer 7 contact with the gate insulator 8. A P-layer 6 contacted with the N-layer 7 on the electrode film 4-1 is configured between the N-layer 7 beneath the electrode film 4-2 and the N-layer 7 on the electrode film 4-1. The P-layer 6 is connected to the N-layer 7 beneath the electrode film 4-2 and the N-layer 7 on the electrode film 4-1. One end of the P-layer 6 contacts with the ferroelectric film 5-1 and the other end of the P-layer 6 contact with the gate insulator 8.

The electrode film 4-2 is configured on a ferroelectric film 5-1 and the N-layer 7. Both end portions of the electrode film 4-2 contact with the gate insulator 8 and are shared as an upper electrode of the film ferroelectric film 5-1 and a lower electrode film of a ferroelectric film 5-2. The ferroelectric film 5-2 is configured between the electrode film 4-2 and an electrode film 4-3. The N-layer 7 on the electrode film 4-2 is connected to the electrode film 4-2. One end of the N-layer 7 contacts with the ferroelectric film 5-2, the other end of the N-layer 7 contacts with the gate insulator 8. The N-layer 7 beneath the electrode film 4-3 is connected to the electrode film 4-3. One end of the N-layer 7 contacts with the ferroelectric film 5-2, the other end of the N-layer 7 contacts with the gate insulator 8. The P-layer 6 contacted with the N-layer 7 on the electrode film 4-2 is configured between the N-layer 7 beneath the electrode film 4-3 and the N-layer 7 beneath the electrode film 4-2. The P-layer 6 is connected to the N-layer 7 beneath the electrode film 4-3 and the N-layer 7 beneath the electrode film 4-2. One end of the P-layer 6 contacts with the ferroelectric film 5-2 and the other end of the P-layer 6 contacts with the gate insulator 8.

The electrode film 4-3 is configured on a ferroelectric film 5-2 and the N-layer 7. Both end portions of the electrode film 4-2 contact with the gate insulator 8 and are shared as an upper electrode of the film ferroelectric film 5-2 and a lower electrode film of a ferroelectric film 5-3. The ferroelectric film 5-3 is configured between the electrode film 4-3 and an electrode film 4-4. The N-layer 7 on the electrode film 4-3 is connected to the electrode film 4-3. One end of the N-layer 7 contacts with the ferroelectric film 5-3, the other end of the N-layer 7 contacts with the gate insulator 8. The N-layer 7 beneath the electrode film 4-4 is connected to the electrode film 4-4. One end of the N-layer 7 contacts with the ferroelectric film 5-3, the other end of the N-layer 7 contacts with the gate insulator 8. The P-layer 6 contacted with the N-layer 7 on the electrode film 4-2 is configured between the N-layer 7 beneath the electrode film 4-4 and the N-layer 7 beneath the electrode film 4-3. The P-layer 6 is connected to the N-layer 7 beneath the electrode film 4-4 and the N-layer 7 beneath the electrode film 4-3. One end of the P-layer 6 contacts with the ferroelectric film 5-3 and the other end of the P-layer 6 contacts with the gate insulator 8.

The electrode film 4-4 is configured on a ferroelectric film 5-3 and the N-layer 7. Both end portions of the electrode film 4-2 contact with the gate insulator 8 and are shared as an upper electrode of the film ferroelectric film 5-3 and a lower electrode film of a ferroelectric film 5-4. The ferroelectric film 5-4 is configured between the electrode film 4-4 and an electrode film 4-5. The N-layer 7 on the electrode film 4-4 is connected to the electrode film 4-4. One end of the N-layer 7 contacts with the ferroelectric film 5-4, the other end of the N-layer 7 contacts with the gate insulator 8. The N-layer 7 beneath the electrode film 4-5 is connected to the electrode film 4-5. One end of the N-layer 7 contacts with the ferroelectric film 5-4, the other end of the N-layer 7 contacts with the gate insulator 8. The P-layer 6 contacted with the N-layer 7 on the electrode film 4-4 is configured between the N-layer 7 beneath the electrode film 4-5 and the N-layer 7 beneath the electrode film 4-4. The P-layer 6 is connected to the N-layer 7 beneath the electrode film 4-5 and the N-layer 7 beneath the electrode film 4-4. One end of the P-layer 6 contacts with the ferroelectric film 5-4 and the other end of the P-layer 6 contacts with the gate insulator 8.

The gate insulator 8 is a gate insulator of the memory cell transistor in the memory cell portion. The gate insulator 8 is configured on both end portions of the electrode films 4-1 to 4-4, an end portion of the P-layer 6, an end portion of the N-layer 7, both end portions of the electrode film 4-5 and an upper portion of the electrode film 4-5. A gate electrode film 10-1 is configured over a part of the end portion of the N-layer 7 beneath the electrode film 4-2 and the P-layer 6 between the N-layer 7 on the electrode film 4-2 and the N-layer 7 beneath the electrode film 4-1 through the gate insulator 8. A gate electrode film 10-2 is configured over a part of the end portion of the N-layer 7 on the electrode film 4-2 and a part of the end portion of the N-layer 7 beneath the electrode film 4-3 and the P-layer 6 between the N-layer 7 on the electrode film 4-2 and the N-layer 7 beneath electrode film 4-3 through the gate insulator 8. A gate electrode film 10-3 is configured over a part of the end portion of the N-layer 7 on the electrode film 4-3 and a part of the end portion of the N-layer 7 beneath the electrode film 4-4 and the P-layer 6 between the N-layer 7 on the electrode film 4-3 and the N-layer 7 beneath electrode film 4-4 through the gate insulator 8. A gate electrode film 10-4 is configured over a part of the end portion of the N-layer 7 on the electrode film 4-4 and a part of the end portion of the N-layer 7 beneath the electrode film 4-5 and the P-layer 6 between the N-layer 7 on the electrode film 4-4 and the N-layer 7 beneath electrode film 4-5 through the gate insulator 8.

The P-layer 6 acts as a channel region and a back gate (substrate) of the memory cell (N-ch MISFET) in the memory cell portion, and the N-layer 7 act as a source or a drain of the memory cell in memory cell portion. The electrode films 4-1 to 4-5 respectively act as an electrode of the ferroelectric capacitor and a source electrode or a drain electrode of the memory cell in the memory cell portion.

An insulator 9 as an inter-layer insulator is configured over the semiconductor substrate through the insulator 2 so as to cover the gate insulator 8 and the gate electrode films 10-1 to 10-4. A via 11 is embedded in an opening of the gate insulator 8. The insulator 9 is connected to the electrode film 4-5. An interconnection layer 12 is configured on the via 11 and the insulator 9, and an interconnection layer 12 is connected to the via 11.

Here, W(tungsten), for example, is used as the interconnection layer 3. Moreover, a polycrystalline silicon doped with a high concentration impurity can be used as the interconnection layer 3 in stead of W. Pt(platinum) doped with n-type impurities, for example, is used as the electrode films 4-1 to 4-5. In addition, a metal of platinum group and an oxide of platinum group such as Ir(iridium), perovskite oxide with conductivity or organic material with conductivity et. al. can be used in stead of Pt(platinum). PZT($PbZrTiO_3$), which is perovskite oxide, is used as ferroelectric films 5-1 to 5-4. In addition, perovskite oxide such as SBT($SrBi_2Ta_2O_9$), BLT $((Bi, La)_4Ti_3O_{12})$ et.al. or organic polymer et. al. can be used. W, for example, is used as via 11.

As shown in FIG. 2, in a cross-sectional view along line A-A in FIG. 1, the center portion of a cylindrical memory cell portion is a capacitor region Ecap composed of the ferroelectric film 5-1. A peripheral portion around the capacitor region Ecap is a transistor region Etr. The transistor region Etr is composed of the P-layer 6 contacted with the end portion of the capacitor region Ecap. The gate insulator 8 contacted with the P-layer 6. The gate electrode film 10-1 contacted with the end portion of the gate insulator 8.

As shown in FIG. 3, an equivalent circuit of the memory cell portion of the ferroelectric memory 40 can be expressed as four layers stacked in order, each layer having the ferroelectric capacitor and the memory cell paired with the ferroelectric capacitor.

One end of a ferroelectric capacitor 21-1 is connected to a source or a drain of a transistor 22-1 paired with the ferroelectric capacitor 21-1. The other end of the ferroelectric capacitor 21-1 is connected to the drain or the source of the transistor 22-1 paired with the ferroelectric capacitor 21-1. A control signal SG1 is input to a gate of the transistor 22-1, subsequently, the transistor 22-1 is operated to "ON" or "OFF" on the basis of the control signal SG1. The other end of the ferroelectric capacitor 21-1 is connected to one end of a ferroelectric capacitor 21-2 and the drain or the source of the transistor 22-1 is connected to a source or a drain of a transistor 22-2.

One end of a ferroelectric capacitor 21-2 is connected to a source or a drain of a transistor 22-2 paired with the ferroelectric capacitor 21-2. The other end of the ferroelectric capacitor 21-2 is connected to the drain or the source of the transistor 22-2 paired with the ferroelectric capacitor 21-2. A control signal SG1 is input to a gate of the transistor 22-2, subsequently, the transistor 22-2 is operated to "ON" or "OFF" on the basis of the control signal SG2. The other end of the ferroelectric capacitor 21-2 is connected to one end of a ferroelectric capacitor 21-3 and the drain or the source of the transistor 22-2 is connected to a source or a drain of a transistor 22-3.

One end of a ferroelectric capacitor 21-3 is connected to a source or a drain of a transistor 22-3 paired with the ferroelectric capacitor 21-3. The other end of the ferroelectric capacitor 21-3 is connected to the drain or the source of the transistor 22-3 paired with the ferroelectric capacitor 21-3. A control signal SG1 is input to a gate of the transistor 22-3, subsequently, the transistor 22-3 is operated to "ON" or "OFF" on the basis of the control signal SG3. The other end of the ferroelectric capacitor 21-3 is connected to one end of a ferroelectric capacitor 21-4 and the drain or the source of the transistor 22-3 is connected to a source or a drain of a transistor 22-4.

One end of a ferroelectric capacitor 21-4 is connected to a source or a drain of a transistor 22-4 paired with the ferroelectric capacitor 21-4. The other end of the ferroelectric capacitor 21-4 is connected to the drain or the source of the transistor 22-4 paired with the ferroelectric capacitor 21-4. A control signal SG1 is input to a gate of the transistor 22-4, subsequently, the transistor 22-4 is operated to "ON" or "OFF" on the basis of the control signal SG4.

Here, the drain or the source of the transistor 22-4 paired with the other end of the ferroelectric capacitor 21-4 is connected to a shared plate line. Both one end of the ferroelectric capacitor 21-1 and the source or the drain of the transistor 22-4 paired with the ferroelectric capacitor 21-1 is connected to a bit line (BL). The control signals SG1 to SG4 are signals of a word line (WL) respectively. Here, the memory cell portion stacked as four layers is explained. However, the structure is not necessary restricted on the above case, but a number of the layers may be suitably changed.

A selection transistor 23 is coupled to the BL connected to the memory cell portion stacked as four layers. The selection transistor 23 inputs a control signal SS1 to the gate, which operates "ON" or "OFF" on the basis of the control signal SS1. A reading operation on information in the memory cell portion is performed, when the selection transistor 23 turns "ON". A sense amplifier 24 inputs data into the memory cell portion via the selection transistor 23 and outputs the information accompanying with amplifying from the memory cell portion via the selection transistor 23.

Next, a fabricating method of the semiconductor memory device according to the first embodiment of the present invention will be described below in detail with reference to the drawing mentioned above. FIGS. 4-9 are schematic cross-sectional views showing processing steps on the ferroelectric memory including the memory cell portion in the first embodiment of the present invention.

As shown in FIG. 4, the insulator 2 is formed on the semiconductor substrate. A part of the insulator 2 is opened by etching and the interconnection layer 3 composed of W is selectively embedded in the opening. Transistors and interconnections are predominantly formed in the semiconductor substrate 1 to provide a semiconductor circuit (not illustrated). Next, the electrode film 4-1 composed of Pt doped with n-type impurities, P for example, the ferroelectric film 5-1 composed of PZT, the electrode film 4-2 composed of Pt doped with P, the ferroelectric film 5-2 composed of PZT, the electrode film 4-3 composed of Pt doped with P, the ferroelectric film 5-3 composed of PZT, the electrode film 4-4 composed of Pt doped with P, the ferroelectric film 5-4 composed of PZT and the electrode film 4-5 composed of Pt doped with P are stacked in order on the insulator 2 and the interconnection layer 3.

Successively, as shown in FIG. 5, a resist film is formed on a predetermined-formation portion of the memory cell portion by using well-known lithography technology. The resist film as a mask, the electrode film 4-5, the ferroelectric film 5-4, the electrode film 4-4, the ferroelectric film 5-3, the electrode film 4-3, the ferroelectric film 5-2, the electrode film 4-2, the ferroelectric film 5-1 and the electrode film 4-1 are anisotropically etched in order by using RIE (Reactive Ion Etching), for example. Finally, the resist film is striped off.

Figure 6:
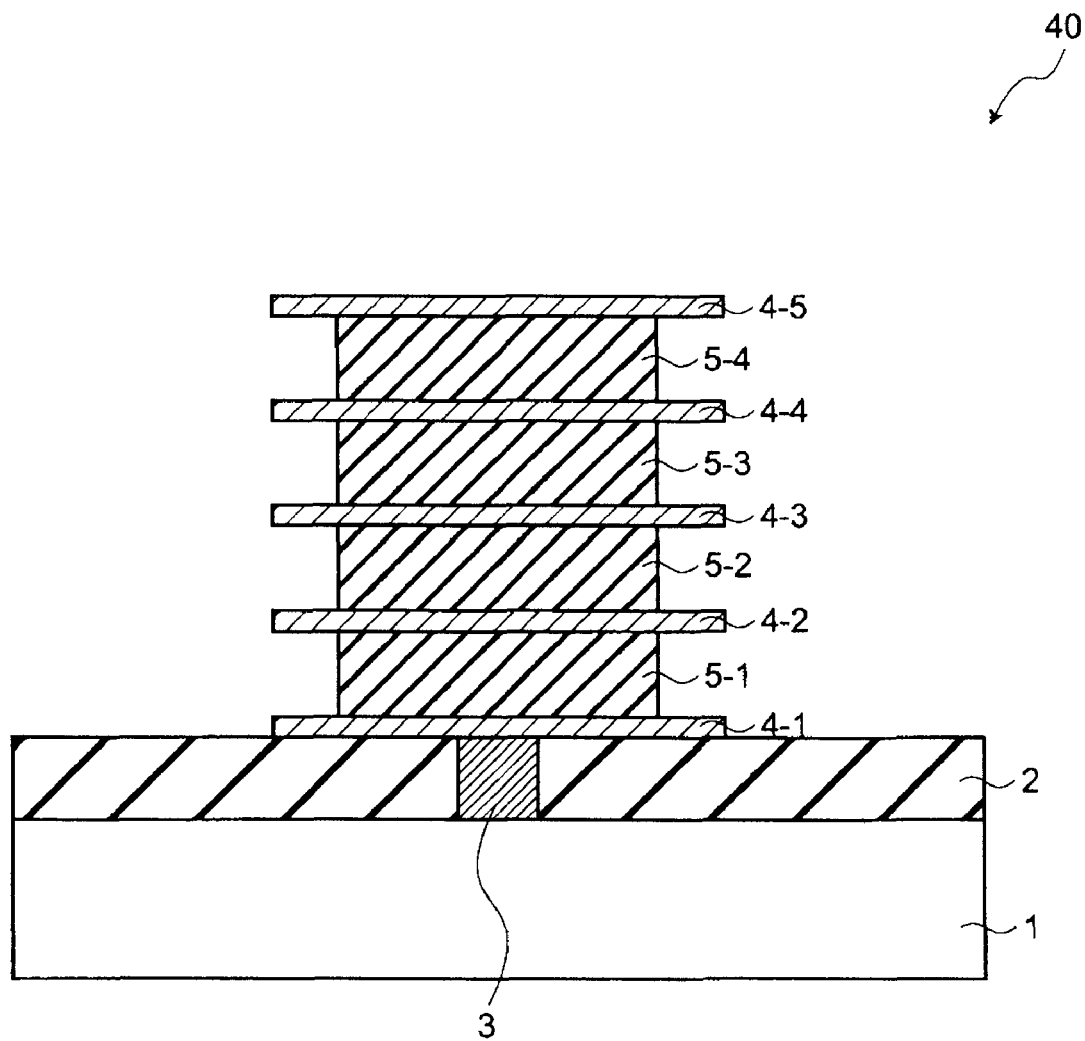
FIG. 6 is a schematic cross-sectional view showing the processing step on the ferroelectric memory including the memory cell portion in the first embodiment of the present invention.

As shown in FIG. 6, the both end portions of the ferroelectric film 5-1 to 5-4 are removed by isotropic etching, for example, wet etching. In the etching, since a etching rate of the electrode films 4-1 to 4-5 is very slow as compared with that of the ferroelectric films 5-1 to 5-4 (larger selectivity), the electrode films 4-1 to 4-5 are scarcely etched.

As shown in FIG. 7, an amorphous silicon film 13 doped with p-type impurities, B (Boron) for example, is deposited by using CVD (Chemical Vapor Deposition). The amorphous silicon film 13 is closely packed without a space in the portion where the ferroelectric films 5-1 to 5-4 are removed by etching so as to contact with the ferroelectric films 5-1 to 5-4. Here, the amorphous silicon film 13 may be formed by using a deposition method at a low temperature below 500° C., such as low temperature and low pressure plasma-assisted CVD or low temperature and normal pressure plasma-assisted CVD. Instead of the amorphous silicon film 13, a Si—Ge film including Ge with a low ratio or the like can be used. Furthermore, p-type impurities may be doped in the film by ion implantation or the like after forming an undoped-amorphous silicon film.

Figure 8:
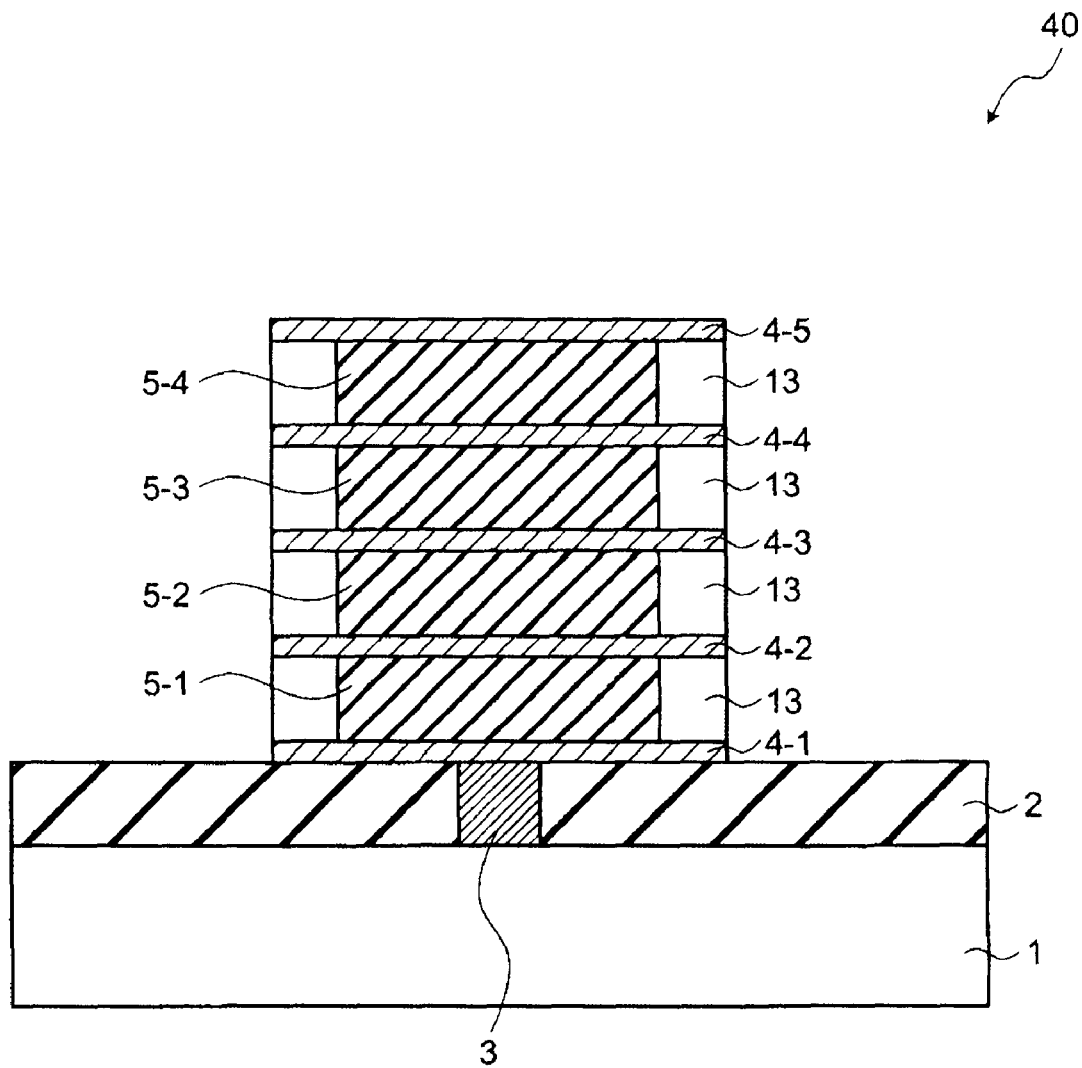
FIG. 8 is a schematic cross-sectional view showing the processing step on the ferroelectric memory including the memory cell portion in the first embodiment of the present invention.

Successively, as shown in FIG. 8, the amorphous silicon film 13 on the memory cell and the periphery of memory cell portion are removed by using RIE, for example. Here, since an etching rate of electrode film 4-5 is set to very low (larger selectivity) as compared with an etching rate of the amorphous silicon film 13, the electrode film 4-5 is hardly etched. As a result, only the amorphous silicon film 13 contacted with the ferroelectric films 5-1 to 5-4 is remained.

Figure 9:
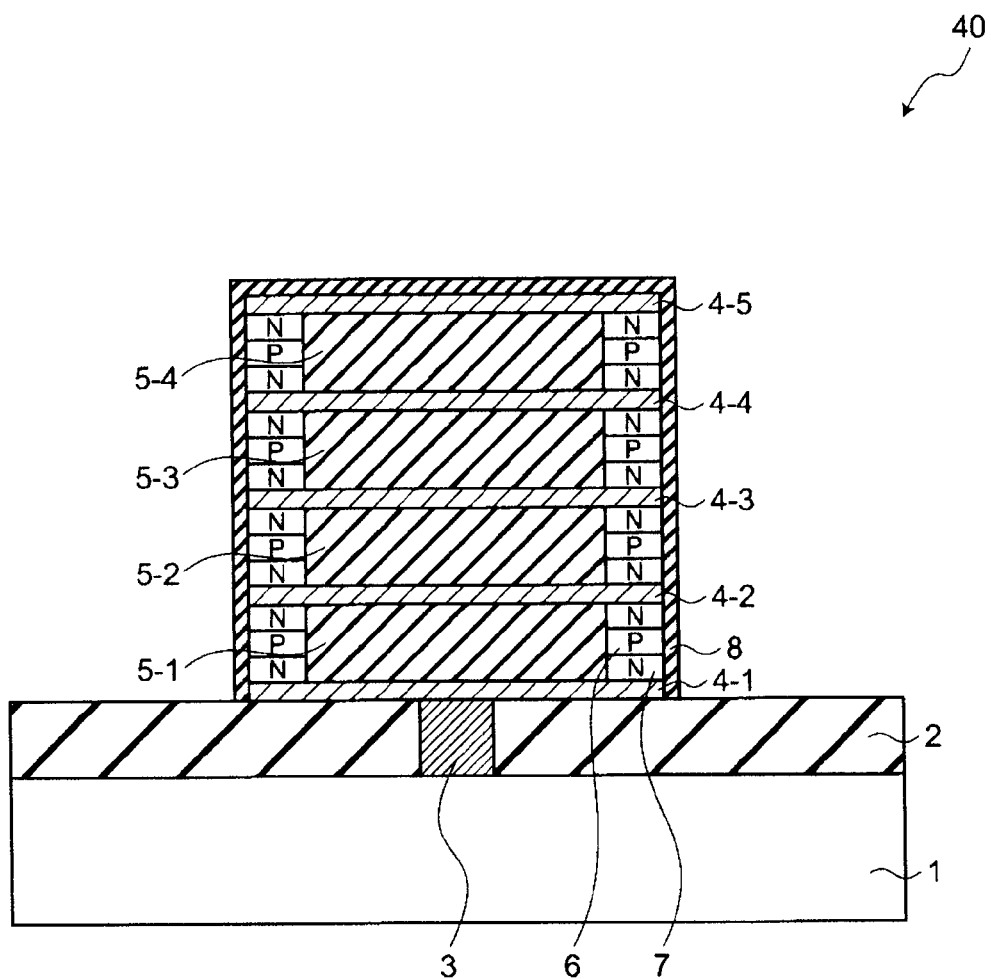
FIG. 9 is a schematic cross-sectional view showing the processing step on the ferroelectric memory including the memory cell portion in the first embodiment of the present invention.

As shown in FIG. 9, the amorphous silicon film 13 is crystallized by annealing at a temperature of nearly 500° C., for example. Here, the amorphous silicon film 13 is crystallized by annealing in a nitrogen atmosphere.

When the annealing is performed in the nitrogen atmosphere, n-type impurities in the electrode films 4-1 to 4-5 are diffused into the amorphous silicon film, as a result, the N-layer 7 is formed in the amorphous silicon film 13 in a manner of self-alignment. As the electrode films 4-1 to 4-5 are composed of Pt electrode film, the amorphous silicon film 13 contacted with Pt electrode film 4-1 to 4-5 is transformed to platinum silicide (not illustrated). As a result, the electrode films 4-1 to 4-5 and the N-layer 7, which is the source or the drain of the memory cell, can have relatively low contact resistance.

A potion diffused no n-type impurities in the amorphous silicon film 13 is activated resulting in the P-layer 6 of the back gate and the channel region. Furthermore, as a composed element of the ferroelectric films 5-1 to 5-4 is diffused from the ferroelectric films 5-1 to 5-4 into the amorphous silicon film 13 directly contacted with ferroelectric films 5-1 to 5-4. Accordingly, the composed element is reacted with the silicon by annealing so as to be formed an insulator (not illustrated). Here, as the ferroelectric films 5-1 to 5-4 are PZT, a silicon oxide film contained large amount of Pb is formed, so that the silicon oxide film electrically separates between the P-layer 6 and the N-layer 7 as conductive layers and the ferroelectric films 5-1 to 5-4 as an insulators.

Next, the thin gate insulator 8 is deposited on an upper surface and a side wall of the cylindrical memory cell portion. The gate insulator 8 becomes a gate insulator of the memory cell transistor (N-ch MISFET) and is composed of hafnium oxide as an oxide film. In addition, an insulator having high permittivity such as aluminum oxide film, silicon oxide film or the like can be used instead of hafnium oxide film. When a silicon oxide film is used, the silicon oxide film may be relatively formed at low temperature, so that the temperature prevents Pt from being abnormally oxidized and being abnormally reacted with the silicon, therefore, Pt is used as the electrode film. Here, the thin gate insulator 8 is formed on the upper surface and the side wall of the cylindrical memory cell portion, however, the gate insulator 8 may be also formed on the insulator 2.

Successively, the insulator 9 as an inter-layer insulator is deposited at a predetermined thickness, which means a height of the gate electrode film 10-1, and the insulator 9 is planarized by reflow technique. The insulator 9 having a good reflow-property, which means reflow at a relatively low temperature, may be preferable. One example of reflow technique is mentioned in this embodiment. In addition, CMP (Chemical Mechanical Polishing) is also planarization technique as an alternative method in this embodiment as other methods. The gate electrode film 10-1 is deposited at a predetermined thickness, which means the thickness containing N-layer 7 being the drain or the source and the P-layer 6 being the source or the drain, and the gate electrode film 10-1 except a portion contacted with the gate insulator 8 is selectively removed by etching.

Successively, the insulator 9 as an inter-layer insulator is deposited at a predetermined thickness, which means a height of gate electrode film 10-2 and the insulator 9 is planarized by reflow technique. The gate electrode film 10-2 is deposited at a predetermined thickness, which means the thickness containing N-layer 7 being the drain or the source and the P-layer 6 being the source or the drain. The gate electrode film 10-2 except a portion contacted with the gate insulator 8 is selectively removed by etching.

Successively, the insulator 9 as an inter-layer insulator is deposited at predetermined thickness, which means a height of gate electrode film 10-3, and the insulator 9 is planarized by reflow technique. The gate electrode film 10-3 is deposited at a predetermined thickness, which means the thickness containing N-layer 7 being the drain or the source and the P-layer 6 being the source or the drain. The gate electrode film 10-3 except a portion contacted with the gate insulator 8 is selectively removed by etching.

Successively, the insulator 9 as an inter-layer insulator is deposited at a predetermined thickness, which means a height of gate electrode film 10-4, and the insulator 9 is planarized by reflow technique. The gate electrode film 10-4 is deposited at a predetermined thickness, which means the thickness containing N-layer 7 being the drain or the source and the P-layer 6 being the source or the drain. The gate electrode film 10-4 except a portion contacted with the gate insulator 8 is selectively removed by etching.

Successively, the insulator 9 as an inter-layer insulator is deposited at a predetermined thickness. A part of the insulator 9 on the cylindrical memory cell and the gate insulator 8 are opened by etching, the via 11 composed of W is selectively embedded. The interconnection layer 12 is formed on the via 11. The via 11 is connected to the interconnection layer 12 and the electrode film 4-5.

After the interconnection layer 12 is formed, an inter-layer insulator, an interconnection layer or the like is further formed by using well-known techniques. As a result, a ferroelectric memory 40 as a Chain FeRAM is completed.

As mentioned above, in the semiconductor memory device and the fabricating method of the semiconductor memory device in this embodiment, the ferroelectric memory 40 having a plurality of cylindrical memory cell portions is formed on the semiconductor substrate 1. The electrode film is configured along perpendicular direction of the ferroelectric film. The memory cell is configured at both ends of the ferroelectric film. The source or the drain of the memory cell is contacted with the electrode film the source and the drain are formed by impurity diffusion from the electrode film. The gate electrode film of the memory cell is formed over the source and the drain via the gate insulator, a portion of the source contacted with the back gate, a portion of the drain contacted with the back gate and a side wall of the back gate. The source, the drain and the back gate of the memory cell is formed of the amorphous silicon film 13 deposited by CVD and annealing.

Since the ferroelectric capacitor and the transistor are stacked in layer and are mutually connected, the ferroelectric capacitor and the transistor vertically having higher packing density can be obtained without miniaturization in plane. On the other hand, a conventional approach on the miniaturization of the ferroelectric capacitor and the transistor are only configured in plane. Moreover, as the miniaturization of the memory cell can be suppressed as compared with a conventional case, characteristic deterioration of the ferroelectric capacitor and the transistor can be prevented.

In addition, in this embodiment, the amorphous silicon film 13 is crystallized by annealing in nitrogen atmosphere. However, laser annealing using a solid laser for example can be used. Moreover, a metal nano-particle coated an organic material is formed on a surface of the amorphous silicon film 13 and a post annealing cause crystallization of amorphous silicon film 13 by the medium of the metal nano-particle. In this case, the annealing mentioned above can crystallize the amorphous silicon film 13 at a lower temperature than the annealing in nitrogen atmosphere. Moreover, the memory cell is configured at the whole periphery of the cylindrical memory cell portion stacked in order. On the other hand, the memory cell can be configured at a portion of the periphery. Furthermore, the memory cell may be formed to contact with the ferroelectric film via the insulator.

Second Embodiment

Figure 10:
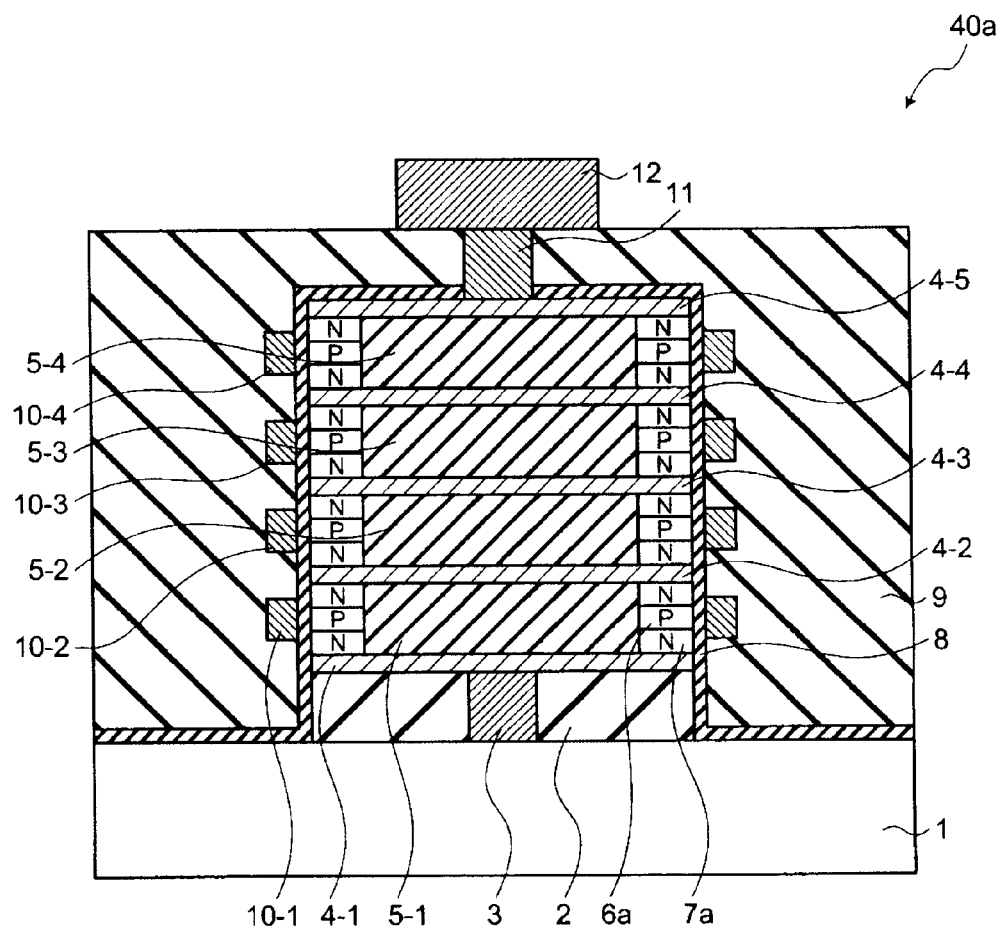
FIG. 10 is a schematic cross-sectional view showing a ferroelectric memory including a memory cell portion in a second embodiment of the present invention.

Next, a semiconductor memory device and the fabricating method of the semiconductor memory device according to a second embodiment of the present invention will be described below in detail with reference to the drawing mentioned above. FIG. 10 is a schematic cross-sectional view showing a ferroelectric memory including a memory cell portion in the second embodiment of the present invention. In the second embodiment, a substrate formation method of a memory cell transistor in a Chain FeRAM as a ferroelectric memory is changed as compared with the substrate formation method in the first embodiment.

It is be noted that the same or similar reference numerals are applied to the same or similar parts and elements throughout the drawings, and the description of the same or similar parts and elements will be omitted or simplified.

As shown in FIG. 10, a ferroelectric memory 40a is a Chain FeRAM as a ferroelectric memory. The ferroelectricmemory 40a having a plurality of cylindrical memory cell portions is formed on the semiconductor substrate 1. The ferroelectric capacitor and a memory cell are stacked in layer. In each memory cell portion, the ferroelectric capacitor and the memory cell are in parallel connected along the longitudinal direction.

An N-layer 7a on the electrode film 4-1 is connected to the electrode film 4-1. One end of the N-layer 7a contacts with the ferroelectric film 5-1 and the other end of the N-layer 7a contact with the gate insulator 8. The N-layer 7a beneath the electrode film 4-2 is connected to the electrode film 4-2. One end of the N-layer 7a contact with the ferroelectric film 5-1 and the other end of the N-layer 7a contact with the gate insulator 8. The P-layer 6a contacted with the N-layer 7a on the electrode film 4-1 is configured between the N-layer 7a beneath the electrode film 4-2 and the N-layer 7a on the electrode film 4-1. The P-layer 6a is connected to the N-layer 7a beneath the electrode film 4-2 and the N-layer 7a on the electrode film 4-1. One end of the P-layer 6a contacts with the ferroelectric film 5-1 and the other end of the P-layer 6 contact with the gate insulator 8.

The N-layer 7a on the electrode film 4-2 is connected to the electrode film 4-2. One end of the N-layer 7a contacts with the ferroelectric film 5-2 and the other end of the N-layer 7a contacts with the gate insulator 8. The N-layer 7a beneath the electrode film 4-3 is connected to the electrode film 4-3. One end of the N-layer 7a contacts with the ferroelectric film 5-2 and the other end of the N-layer 7a contacts with the gate insulator 8. The P-layer 6a contacted with the N-layer 7a on the electrode film 4-2 is configured between the N-layer 7a beneath the electrode film 4-3 and the N-layer 7a beneath the electrode film 4-2. The P-layer 6a is connected to the N-layer 7a beneath the electrode film 4-3 and the N-layer 7a beneath the electrode film 4-2. One end of the P-layer 6a contacts with the ferroelectric film 5-2 and the other end of the P-layer 6 contacts with the gate insulator 8.

The N-layer 7a on the electrode film 4-3 is connected to the electrode film 4-3. One end of the N-layer 7 contacts with the ferroelectric film 5-3 and the other end of the N-layer 7a contacts with the gate insulator 8. The N-layer 7a beneath the electrode film 4-4 is connected to the electrode film 4-4. One end of the N-layer 7a contacts with the ferroelectric film 5-3 and the other end of the N-layer 7a contacts with the gate insulator 8. The P-layer 6a contacted with the N-layer 7a on the electrode film 4-2 is configured between the N-layer 7a beneath the electrode film 4-4 and the N-layer 7a beneath the electrode film 4-3. The P-layer is connected to the N-layer 7a beneath the electrode film 4-4 and the N-layer 7a beneath the electrode film 4-3. One end of the P-layer 6a contacts with the ferroelectric film 5-3 and the other end of the P-layer 6 contacts with the gate insulator 8.

The N-layer 7a on the electrode film 4-4 is connected to the electrode film 4-4. One end of the N-layer 7a contacts with the ferroelectric film 5-4 and the other end of the N-layer 7a contacts with the gate insulator 8. The N-layer 7a beneath the electrode film 4-5 is connected to the electrode film 4-5. One end of the N-layer 7a contacts with the ferroelectric film 5-4 and the other end of the N-layer 7a contacts with the gate insulator 8. The P-layer 6a contacted with the N-layer 7a on the electrode film 4-4 is configured between the N-layer 7a beneath the electrode film 4-5 and the N-layer 7a beneath the electrode film 4-4. The P-layer is connected to the N-layer 7a beneath the electrode film 4-5 and the N-layer 7a beneath the electrode film 4-4. One end of the P-layer 6a contacts with the ferroelectric film 5-4 and the other end of the P-layer 6 contacts with the gate insulator 8.

The gate insulator 8 is a gate insulator of the memory cell transistor in the memory cell portion and is configured on a surface of the semiconductor substrate 1, both end portions of the insulator 2, both end portions of the electrode films 4-1 to 4-4, an end portion of the P-layer 6a, an end portion of the N-layer 7, both end portions of the electrode film 4-5 and an upper portion of the electrode film 4-5.

The P-layer 6a acts as a channel region and the back gate (substrate) of the memory cell (N-ch MISFET) in the memory cell portion, and the N-layer 7a act as a source or a drain of the memory cell in memory cell portion.

Figure 13:
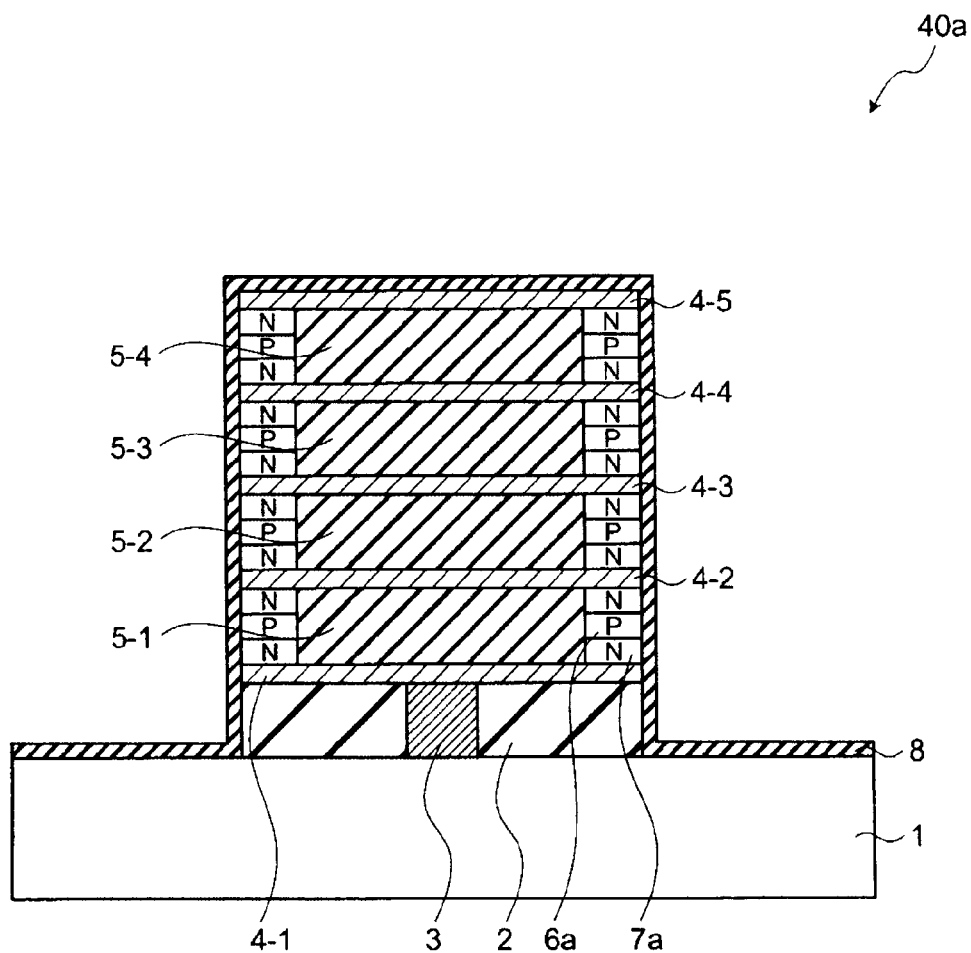
FIG. 13 is a schematic cross-sectional view showing the processing step on the ferroelectric memory including the memory cell portion in the second embodiment of the present invention.

Next, a fabricating method of the semiconductor memory device according to the second embodiment of the present invention will be described below in detail with reference to the drawing mentioned above. FIGS. 11-13 are schematic cross-sectional views showing processing steps on the ferroelectric memory including the memory cell portion in the second embodiment of the present invention. As the processing steps being from the beginning step to the step of etching the electrode film 4-5, the ferroelectric film 5-4, the electrode film 4-4, the ferroelectric film 5-3, the electrode film 4-3, the ferroelectric film 5-2, the electrode film 4-2, the ferroelectric film 5-1 and the electrode film 4-1 in order by using RIE is the same as the processing steps in the first embodiment, the explanation is omitted.

As shown in FIG. 6, after the electrode film 4-1 is anisotropically etched, the insulator 2 also anisotropically etched so as to expose the semiconductor substrate 1 using a resist film as a mask. Finally, the resist film is removed.

Next, an epitaxial silicon film 14 doped with p-type impurities, B (Boron) for example, is formed by using CVD (Chemical Vapor Deposition). The epitaxial silicon film 14 is closely packed without a space in the portion where the ferroelectric films 5-1 to 5-4 are removed by etching so as to contact with the ferroelectric films 5-1 to 5-4. Here, the epitaxial silicon film 14 may be formed by using a deposition method at a low temperature range between 450° C. and 500° C., such as low temperature and low pressure plasma-assisted CVD or low temperature and normal pressure plasma-assisted CVD. Instead of the epitaxial silicon film 14, a Si—Ge film having Ge with a low ratio or the like can be used.

Successively, as shown in FIG. 12, the epitaxial silicon film 14 on the memory cell and the periphery of the memory cell portion are removed by using RIE, for example. Here, since an etching rate of electrode film 4-5 is set to very low (larger selectivity) as compared with an etching rate of the epitaxial silicon film 14, the electrode film 4-5 is hardly etched. As a result, the epitaxial silicon film 14 contacted with the ferroelectric films 5-1 to 5-4 is only remained.

As a surface portion of the semiconductor substrate 1 is etched by RIE, damages are easily generated in the semiconductor substrate 1 during the RIE process. Here, the damages are generated by radiation of electrons or ions in a plasma atmosphere or irradiation lights. Therefore, the neutral particles may be used as a source of RIE etching, after minus charged particles or plus charged particles are forced to be electrically neutral.

Furthermore, p-type impurities may be doped in the film by ion implantation with an angle using B as an impurity or the like after forming an undoped-epitaxial silicon film, in stead of the epitaxial silicon film 14 doped with B.

As shown in FIG. 12, the epitaxial silicon film 14 is annealed at a temperature of nearly 500° C. in a nitrogen atmosphere. Here, the amorphous silicon film 13 is crystallized by annealing in a nitrogen atmosphere.

When the annealing is performed in the atmosphere, n-type impurities in the electrode films 4-1 to 4-5 are diffused into the epitaxial silicon film 14. As a result, the N-layer 7 is formed in the epitaxial silicon film 14 in a manner of self-alignment. As the electrode films 4-1 to 4-5 composed of Pt electrode film, the epitaxial silicon film 14 contacted with Pt electrode film 4-1 to 4-5 is transformed to platinum silicide (not illustrated). As a result, the electrode films 4-1 to 4-5 and the N-layer 7, which is the source or the drain of the memory cell, can have relatively low contact resistance.

Furthermore, a composed element of the ferroelectric films 5-1 to 5-4 is diffused from the ferroelectric films 5-1 to 5-4 into the epitaxial silicon film 14 directly contacted with ferroelectric films 5-1 to 5-4. Accordingly, the composed element is reacted with the silicon by annealing so as to be formed an insulator (not illustrated).

Next, the thin gate insulator 8 is deposited on an upper surface and a side wall of the cylindrical memory cell portion. The gate insulator 8 becomes a gate insulator of the memory cell transistor (N-ch MISFET) and is composed of hafnium oxide as an oxide film. As processing steps that follow are the same as the processing steps in the first embodiment, the explanation is omitted.

As mentioned above, in the semiconductor memory device and the fabricating method of the semiconductor memory device in this embodiment, the ferroelectric memory 40 having a plurality of cylindrical memory cell portions is formed on the semiconductor substrate 1. The electrode film is configured along perpendicular direction of the ferroelectric film. The memory cell is configured at both ends of the ferroelectric film. The source or the drain of the memory cell is contacted with the electrode film. The source and the drain are formed by impurity diffusion from the electrode film. The gate electrode film of the memory cell is formed via the gate insulator over a portion of the source contacted with the back gate, a portion of the drain contacted with the back gate and side walls of the back gate. The source, the drain and the back gate of the memory cell is formed of the epitaxial silicon film 14 deposited by CVD and annealing.

Since the ferroelectric capacitor and the transistor are stacked in layer and are mutually connected, the ferroelectric capacitor and the transistor having vertically higher packing density can be obtained without miniaturization in plane. On the other hand, a conventional approach on the miniaturization of the ferroelectric capacitor and the transistor are only configured in plane. Moreover, as the miniaturization of the memory cell can be suppressed as compared with a conventional case, characteristic deterioration of the ferroelectric capacitor and the transistor can be prevented.

In addition, in this embodiment, hafnium oxide is used as an oxide film 8. However, a layered structure composed of silicon nitride ($Si_3N_4$)/silicon oxide or high permittivity films (high-k gate insulators) except hafnium oxide, for example, can be used as a gate insulator. Moreover, using silicon nitride as a part of the gate insulator 8 leads to prevent a reduction degradation of a ferroelectric film generated in a hydrogen treatment or the like.

Third Embodiment

Next, a semiconductor memory device according to a third embodiment of the present invention will be described below in detail with reference to the drawing mentioned above. FIG. 14 is a schematic plane view showing a ferroelectric memory including a memory cell portion in the third embodiment of the present invention. In this embodiment, a feature of a memory cell portion in a Chain FeRAM as a ferroelectric memory is changed as compared with the feature of the memory cell portion in the first embodiment.

It is be noted that the same or similar reference numerals are applied to the same or similar parts and elements throughout the drawings, and the description of the same or similar parts and elements will be omitted or simplified.

As shown in FIG. 14, a memory cell portion of a ferroelectric memory 40b has a square prism type. The center of the memory cell portion with the square prism type is a capacitor region Ecap composed of the ferroelectric film 5. A peripheral portion around the capacitor region Ecap is a transistor region Etr. The transistor region Etr is composed of the P-layer 6 contacted with the end portion of the capacitor region Ecap, gate insulator 8 contacted with the P-layer 6 and the gate electrode film 10 contacted with the end portion of the gate insulator 8. The memory cell portion with the square prism type enable to minimize a space between memory cell portions so as to improve the integrity of the ferroelectric memory as compared with the cylindrical memory cell portion in the first embodiment As mentioned above, in the semiconductor memory device in this embodiment, the ferroelectric memory 40b having a plurality of square prism memory cell portions is formed on the semiconductor substrate 1. The electrode film is configured along perpendicular direction of the ferroelectric film. The memory cell is configured at both ends of the ferroelectric film.

Since the ferroelectric capacitor and the transistor are stacked in layer and are mutually connected, the ferroelectric capacitor and the transistor having vertically higher packing density can be obtained without miniaturization in plane. On the other hand, a conventional approach on the miniaturization of the ferroelectric capacitor and the transistor are only configured in plane. Moreover, as the miniaturization of the memory cell can be suppressed as compared with a conventional case, characteristic deterioration of the ferroelectric capacitor and the transistor can be prevented. Furthermore, as the feature of the memory cell portion is the square prism type, the packing density of the ferroelectric memory in the third embodiment can be higher than that of the ferroelectric memory in the first embodiment.

Other embodiments of the present invention will be apparent to those skilled in the art from consideration of the specification and practice of the invention disclosed herein. It is intended that the specification and example embodiments be considered as exemplary only, with a true scope and spirit of the invention being indicated by the claims that follow. The invention can be carried out by being variously modified within a range not deviated from the gist of the invention.

For example, the memory cell portions in the first and the second embodiments and the third embodiment are the cylindrical type and the square prism type, respectively. However, the memory cell portion is not restricted to the cases mentioned above, a triangular prism type, a hexagonal prism type or a polygonal prism type, for example, may also be suitable to the memory cell portion.

What is claimed is:

1. A semiconductor memory device, comprising:
   a memory cell portion,
   the memory cell portion comprising a ferroelectric capacitor and a memory cell transistor,
   the ferroelectric capacitor comprising a first electrode film on a semiconductor substrate, a second electrode film over the first electrode film, and a ferroelectric film between the first and second electrode films,
   the memory cell transistor comprising a source and a drain between the first and second electrode films, wherein either the source or the drain connects to the first electrode film, and the other of the source or the drain connects to the second electrode film, and
   wherein a shape of the memory cell portion is at least a cylindrical type, a square prism type, a triangular prism type or a hexagonal prism type.

2. A semiconductor memory device, comprising:
   a memory cell portion,
   the memory cell portion comprising a ferroelectric capacitor and a memory cell transistor,
   the ferroelectric capacitor comprising a first electrode film on a semiconductor substrate, a second electrode film over the first electrode film, and a ferroelectric film between the first and second electrode films,
   the memory cell transistor comprising a source and a drain between the first and second electrode films, wherein either the source or the drain connects to the first electrode film, and the other of the source or the drain connects to the second electrode film, and wherein the memory cell transistor surrounds a sidewall of the ferroelectric film.

3. A semiconductor memory device, comprising:

a memory cell portion;

the memory cell portion comprising a plurality of ferroelectric capacitors as a layered structure and a plurality of memory cell transistors, the layered structure of the plurality of ferroelectric capacitors comprising an $n$—th electrode film, an $n$—th ferroelectric film, an $(n+1)$—th electrode film, an $(n+1)$—th ferroelectric film and an $(n+2)$—th electrode film, each of the ferroelectric capacitors comprising a first electrode film on a semiconductor substrate, a second electrode film over the first electrode film, and a ferroelectric film between the first and second electrode films, and the plurality of memory cell transistors comprising an $n$—th memory cell transistor and an $(n+1)$th memory cell transistor, each of the memory cell transistors comprising a source and a drain between the first and the second electrode films, wherein either of the source or the drain of the n-th memory cell transistor connects to the n-th electrode film, and the other of the source or the drain connects to the $(n+1)$-th electrode film, and either of a source or a drain of the $(n+1)$-th memory cell transistor connects to the $(n+1)$-th electrode film, and the other of the source or the drain connects to the $(n+2)$-th electrode film, where n is an integer more than one.

4. The semiconductor memory device according to claim 3, wherein a shape of the memory cell portion is a cylindrical type, a square prism type, a triangular prism type or a hexagonal prism type.

5. The semiconductor memory device according to claim 3, wherein the memory cell transistor surrounds a sidewall of the ferroelectric film.

* * * * *